United States Patent [19]

Edmond et al.

[11] Patent Number: 5,604,135

[45] Date of Patent: Feb. 18, 1997

[54] METHOD OF FORMING GREEN LIGHT EMITTING DIODE IN SILICON CARBIDE

[75] Inventors: John A. Edmond, Cary; Alexander V. Suvorov, Durham, both of N.C.

[73] Assignee: Cree Research, Inc., Durham, N.C.

[21] Appl. No.: 290,020

[22] Filed: Aug. 12, 1994

[51] Int. Cl.$^6$ .......................... H01L 21/24; H01L 21/329
[52] U.S. Cl. ............................... 437/22; 437/23; 437/25; 437/100; 437/905; 148/DIG. 148
[58] Field of Search .................................. 437/22, 23, 25, 437/100, 127, 905; 148/DIG. 148; 117/902, 951; 257/77, 87, 102, 103

[56] References Cited

U.S. PATENT DOCUMENTS

| | | | |
|---|---|---|---|
| 4,912,064 | 3/1990 | Kong et al. | 437/100 |
| 4,918,497 | 4/1990 | Edmond . | |
| 4,945,394 | 7/1990 | Palmour et al. | 437/100 |
| 4,992,704 | 2/1991 | Stinson | 315/312 |
| 5,011,549 | 4/1991 | Kong et al. | 148/33.1 |
| 5,027,168 | 6/1991 | Edmond . | |
| 5,063,421 | 11/1991 | Suzuki et al. . | |
| 5,087,576 | 2/1992 | Edmond et al. | 437/22 |
| 5,187,547 | 2/1993 | Niina et al. | 257/77 |
| 5,243,204 | 9/1993 | Suzuki et al. | 257/77 |
| 5,281,831 | 1/1994 | Uemoto et al. | 257/102 |
| 5,302,839 | 4/1994 | Kaise et al. | 257/101 |
| 5,306,662 | 4/1994 | Nakamura et al. | 437/107 |
| 5,307,359 | 4/1994 | Sarraf | 372/21 |
| 5,416,342 | 5/1995 | Edmond et al. | 257/77 |

FOREIGN PATENT DOCUMENTS 1774400  7/1992  U.S.S.R. .................................. 257/77

OTHER PUBLICATIONS

S. A. Belova et al., Sov. Phys. Semicond., 10(7)(1976)743 "... B–SiC single crystals implantation doped with Al" Jul. 1976.

R. R. Hart et al., Abstract of Proc. of 2nd Int'l. Conf. on Ion Implant. in Semicond. (1971) 134 "Backscattering ... SiC implanted with 40KeV indium" May 1971.

H. J. Kim et al., Abstract of Proc. of 1st Int'l. SAMPE Electron. Conf., I(1987)370, "Epitaxial growth ... beta–SiC ... " Jun. 1987.

J. A. Edmond et al., Abstract of MRS Interfaces, Superlatt. & Thin Films Symp., (1987) 193, "High temperature implantation of ... beta silicon carbide ... " 1987.

V. M. Gusev et al., Radiation Effects 69(1983)307 (abstract), "... Al +implanted alpha SiC ... " 1983.

L. F. Gudymenko et al., Optoelectronica i Polupr. Tekhnika (Soviet Optoelectronics and Semicond. Technol.) 10(1986)72 (Abstract), "... Ion implanted SiC light emitting structures" 1986.

L. I. Berezhinskii et al., Ukrayin. Fizychnyi Zhurnal (Ukranian J. Phys.) 34(11)(1989)1698 (abstract) "Blue–green electrolum. of a alpha–SiC ... " 1989.

(List continued on next page.)

Primary Examiner—Charles L. Bowers, Jr.
Assistant Examiner—Leon Radomsky
Attorney, Agent, or Firm—Bell, Seltzer, Park & Gibson, P.A.

[57] ABSTRACT

A light emitting diode is disclosed that emits in the green portion of the visible spectrum, along with a method of producing the diode. The light emitting diode comprises a 6H silicon carbide substrate having a planar surface inclined more than one degree off axis toward one of the <11$\bar{2}$0> directions; an ohmic contact to the substrate; a first epitaxial layer of 6H silicon carbide on the inclined surface of the substrate and having a first conductivity type; a second epitaxial layer of 6H silicon carbide on the first layer and having the opposite conductivity type for forming a p-n junction between the first and second layers; and an ohmic contact to the second epitaxial layer. The diode produces a peak wavelength of between about 525 and 535 nanometers with a spectral half width of no more than about 90 nanometers.

17 Claims, 3 Drawing Sheets

OTHER PUBLICATIONS

Vodakov et al., *Efficient Green–Emitting Silicon Carbide Diodes*, Sov. Phys. Semicond., vol. 26, No. 1, Jan. 1992, pp. 59–61.

Neudeck et al., *Greatly Improved 3C–SiC p–n Junction Diodes Grown by Chemical Vapor Deposition*, IEEE Electron Device Letters, vol. 14, No. 3, Mar. 1993, pp.136–139.

Dmitriev et al., *Three–Color Blue–Green–Red Display Made From One Single Crystal*, Sov. Tech. Phys. Lett., vol. 12, No. 5, May 1986, p. 221.

Vodakov et al., *Light–Emitting Diodes Made From Silicon Carbide Bombarded With Fast Electrons*, Sov. Phys. Semicond., vol. 26, No. 11, Nov. 1992, pp. 1041–1043.

A. V. Suvorov et al., *Highly Effective Ion–Implanted Green 6H–SiC LEDs*, Inst. Phys. Conf. Ser. No. 137, Chapter 6 (paper presented at the 5th SiC and Related Materials Conf., Washington, D.C., 1993), pp. 531–532.

METHOD OF FORMING GREEN LIGHT EMITTING DIODE IN SILICON CARBIDE

FIELD OF THE INVENTION

The present invention relates to light emitting diodes and in particular relates to a light emitting diode formed in silicon carbide that will emit in the true green portion of the visible spectrum at or about 530 nanometers (nm).

BACKGROUND OF THE INVENTION

Light emitting diodes are one type of semiconductor devices within the category known as photonic or optoelectronic devices. Other photonic devices include photodetectors (i.e., devices that detect optical signals) and photovoltaic devices (i.e., devices that convert optical radiation into electrical energy).

Light emitting diodes have gained wide acceptance and usage for reasons similar to those behind the wide ranging acceptance and uses of other semiconductor devices: their small size, relatively low cost, low power requirements, and many other factors that have driven growth in all segments of the electronics industry in the past few decades.

The colors that can be produced by a light emitting diode, however, are fundamentally related to the semiconductor material from which the LED is formed. In turn, the fundamental property of the material that defines the available colors is the material's bandgap. As is well known to those familiar with electronic transitions, the bandgap is the energy difference between the valence band and the conduction band of a semiconductor material. Thus, the transitions between bands give off light of a certain energy, and the material's bandgap represents the maximum light energy that the material can produce. In turn, the energy of such light—alternatively expressed as the energy of the photon produced by the bandgap transition—is expressed as its wavelength and frequency. In the visible portion of the electromagnetic spectrum, different wavelengths (which is inversely proportional to the energy emitted) and frequencies (which is directly proportional to the energy emitted) appear as different colors to the human eye.

Obtaining accurate primary colors such as red, blue, and green from LEDs is a desirable goal as various full color devices (e.g., displays, lasers, photocopiers, detectors, etc.) cannot operate most effectively and efficiently if the primary colors are unavailable. Instead, various light filtering and blending techniques must be used.

The green portion of the visible spectrum; i.e., that portion that defines light that will appear to human eyesight as the color green, is between about 492 and 577 nanometers (nm). See; Sze, *Physics of Semiconductor Devices*, 2d Ed. (1981) p. 683. To date, most "green" LEDs are formed of gallium phosphide (GaP) doped with nitrogen (N). The standard transition in gallium phosphide produces a 565 nm photon which is well towards the yellow portion of the spectrum and thus the emitted light has more of a yellow-green appearance than a true green appearance. Some gallium phosphide light emitting diodes have produced emissions at about 555 nm, but none have demonstrated emission at shorter wavelengths (higher frequencies) that would produce a more true green color.

Silicon carbide is a ideal candidate material for semiconductor devices, and particularly for LEDs requiring relatively large bandgaps in order to produce colors in the higher energy portion of the visible spectrum; i.e. green, blue and violet. For example, the use of silicon carbide to successfully produce blue light emitting diodes (i.e., higher energy, higher frequency, and shorter wavelength than green light) is set forth in U.S. Pat. Nos. 4,918,497 and 5,027,168 both to Edmond, and both assigned to the assignee of the present invention. Because silicon carbide has an appropriately wide bandgap, 3.0 electron volts (eV) at room temperature, it can theoretically provide transitions that will produce photons of any color in the visible spectrum, and indeed some into the ultraviolet (UV) portions of the electromagnetic spectrum.

A specific color, however, requires a transition of a specific energy. Thus, a true green photon with a wavelength of about 530 nm, must be produced by a transition of about 2.3 eV. This transition is within the bandgap of silicon carbide, but does not represent silicon carbide's full bandgap. Thus, some mechanism must be provided for 530 nm events to occur within the larger bandgap of silicon carbide. Page 684 of Sze, supra, gives a brief discussion of such mechanisms, which are well understood by those of ordinary skill in this art.

A number of attempts at the true green 530 nm LED have been carried out to date. In 1986, Demitriev et al., Sov Tech. Phys. Lett. 12(5) May 1986, p. 221, reported on a three color display formed in silicon carbide in which epitaxial layers were produced by liquid phase epitaxy and ion implantation. Stinson, U.S. Pat. No. 4,992,704 describes a variable color light emitting diode, but offers no explanation or suggestion as to how the green diode he incorporates could be produced or its structure.

Suzuki et al., U.S. Pat. No. 5,063,421 describes a silicon carbide LED that emits in potential color ranges from green to purple in which a tetravalent transition element (titanium, zirconium, or hafnium) acts as the luminescent center. Vodakov et al., Sov. Phys. Semicond. 26(1) January 1992, pp. 59–61, describe "pure green" silicon carbide LEDs in the 530 nm wavelength, produced by "sublimation epitaxy."

In a later effort, Vodakov et al. Sov Phys. Semicond. 26(11) November 1992, pp. 1041–1043, report silicon carbide diodes that produce in the 510–530 nm region grown by vapor phase epitaxy and then bombarded with fast electrons.

Niina et al., U.S. Pat. No. 5,187,547 describes a specific silicon carbide LED structure that it provides a 482 nm peak wavelength. Those familiar with such devices will, however, recognize this as being blue emitting rather than green.

Suzuki et al., U.S. Pat. No. 5,243,204 discloses several green emitting LEDs in silicon carbide, one of which Suzuki describes as a pair of epitaxial layers of 3C (beta) silicon carbide on a beta silicon carbide substrate and an emission at a peak wavelength of 544 nm. Bulk single crystals of beta silicon carbide have yet to make a wide appearance, however, and Suzuki's example may be predictive, rather than descriptive.

Kaise et al., U.S. Pat. No. 5,302,839 is an example of a gallium phosphide green light emitting diode.

Neudeck et al., IEEE Electron Device Letters, 14(3) March 1993, pp. 136–139, describe 3C silicon carbide junction diodes, but confirm that there is a general lack of 3C substrates suitable for mass production. Thus, the diodes described by Neudeck et al. are all grown on 6H (alpha) silicon carbide substrates.

Finally, Suvorov et al., *High-Effective Ion-Implanted Green GH-SiC LEDs*, describe green LEDs produced from 6H silicon carbide through ion implantation to produce the required p-n junctions. The described device had wavelengths of between 530–540 nm, but were considered to have unsatisfactory electrical characteristics and effectiveness. In particular, none of these devices showed outputs greater than about 15 or 20 microwatts at the standard measuring current of 20 milliamps.

OBJECT AND SUMMARY OF THE INVENTION

Therefore, it is an object of the present invention to provide a true green light emitting diode formed in silicon carbide with an improved efficiency and output that helps make the diodes much more suitable for widespread commercial application.

The invention meets this object with a light emitting diode that emits in the green portion of the visible spectrum. The diode comprises a 6H silicon carbide substrate having a planar surface inclined more than one degree off axis towards one of the <11$\bar{2}$0> directions, an ohmic contact to the substrate, a first epitaxial layer of 6H silicon carbide on the inclined surface of the substrate and having a first conductivity type, a second layer of 6H silicon carbide on the first layer and having the opposite conductivity type for forming a p-n junction between the first and second layers, and an ohmic contact to the second layer. The second layer (which as noted below can be an epitaxial layer) comprises a series of recombination centers that produce a peak wavelength of about 530 nm at ambient temperature and with a spectral half width of no more than about 90 nm.

In another aspect, the invention comprises the method of producing the green light emitting diode by depositing the first epitaxial layer of 6H silicon carbide on a prepared planar surface of a 6H silicon carbide substrate in which the planar surface is inclined more than one degree off axis with respect to a basal plane thereof substantially towards one of the <11$\bar{2}$0> directions. The method further comprises directing an ion implantation beam of dopant ions onto the first epitaxial layer while maintaining the layer at a temperature high enough to position dopant atoms at substitutional lattice sites in the epitaxial layer but less than the temperature at which excessive graphitization of the silicon carbide would occur to produce an implanted layer on the first epitaxial layer having the opposite conductivity type from the first layer, and to thereby produce a p-n junction between the first layer and the implanted layer. Finally, the method comprises removing graphite from the surface of the implanted layer without effecting the electronic characteristics of the implanted layer or the junction.

These and other objects of the invention will be understood more clearly in conjunction with the accompanying drawings which illustrate preferred and exemplary embodiments and wherein:

DETAILED DESCRIPTION

Figure 1:
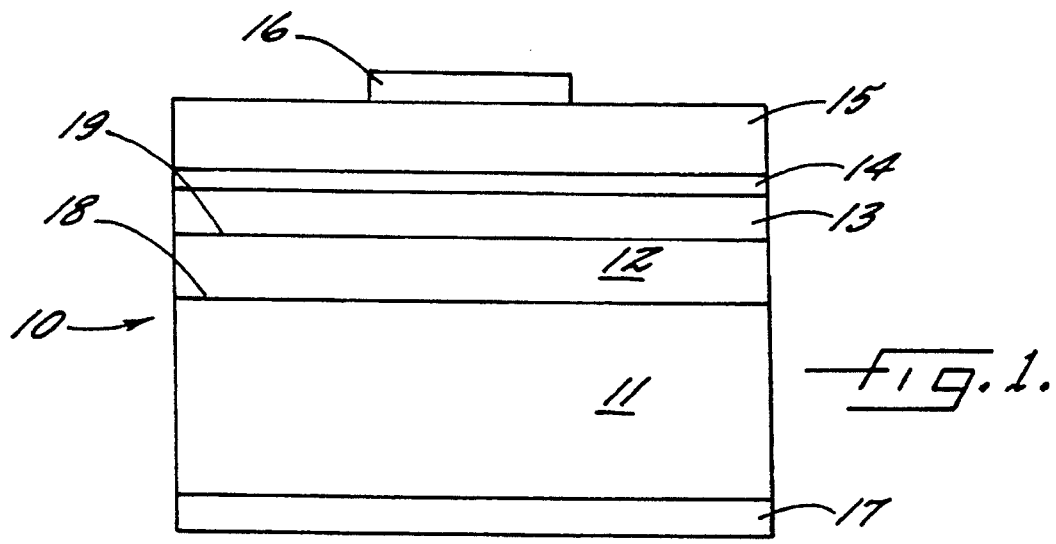
FIG. 1 is a cross-sectional diagram of a preferred embodiment of a diode according to the present invention.
Figure 2:
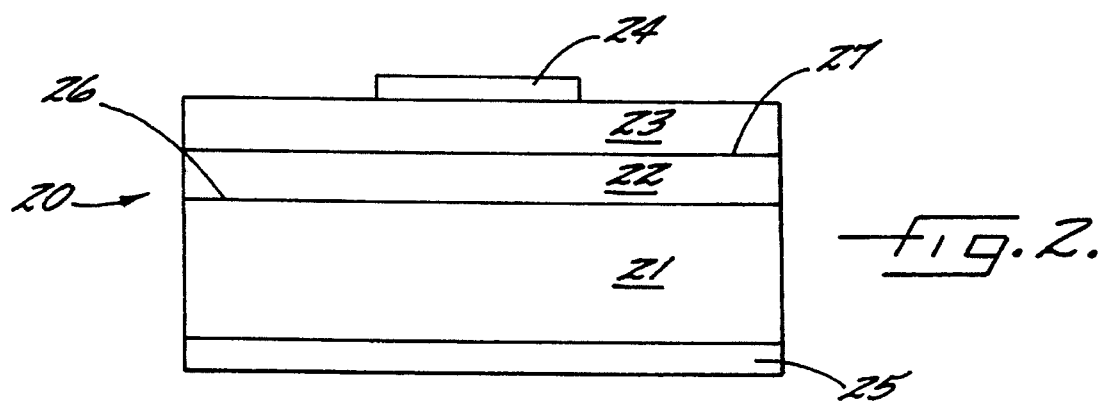
FIG. 2 is a similar cross-sectional view of a more basic embodiment according to the present invention.

FIGS. 1 and 2 illustrate preferred structural embodiments of the present invention. FIG. 2 shows the more fundamental structure of the invention broadly designated at 20. The diode 20 is formed of a 6H silicon carbide substrate 21 that has a planar surface 26 inclined more than 1° off axis towards one of the <11$\bar{2}$0> directions. An ohmic contact 25 is made to the substrate 21, preferably on the surface opposite the inclined surface 26. Such an arrangement results in a "vertical" structure that is preferred for many applications, and that is one of the advantages of the silicon carbide substrate and epitaxial layers. A first epitaxial layer 22 of 6H silicon carbide is on the inclined surface 26 of the substrate 21 and has a first conductivity type. A second layer 23 of 6H silicon carbide is adjacent the first layer 22 and has the opposite conductivity type for forming a p-n junction 27 between the first layer 22 and the second layer 23. As will be described in more detail herein with respect to the method aspects of the invention, the second layer 23 is preferably formed by implanting opposite conductivity type dopant ions into the first layer 22.

Figure 3:
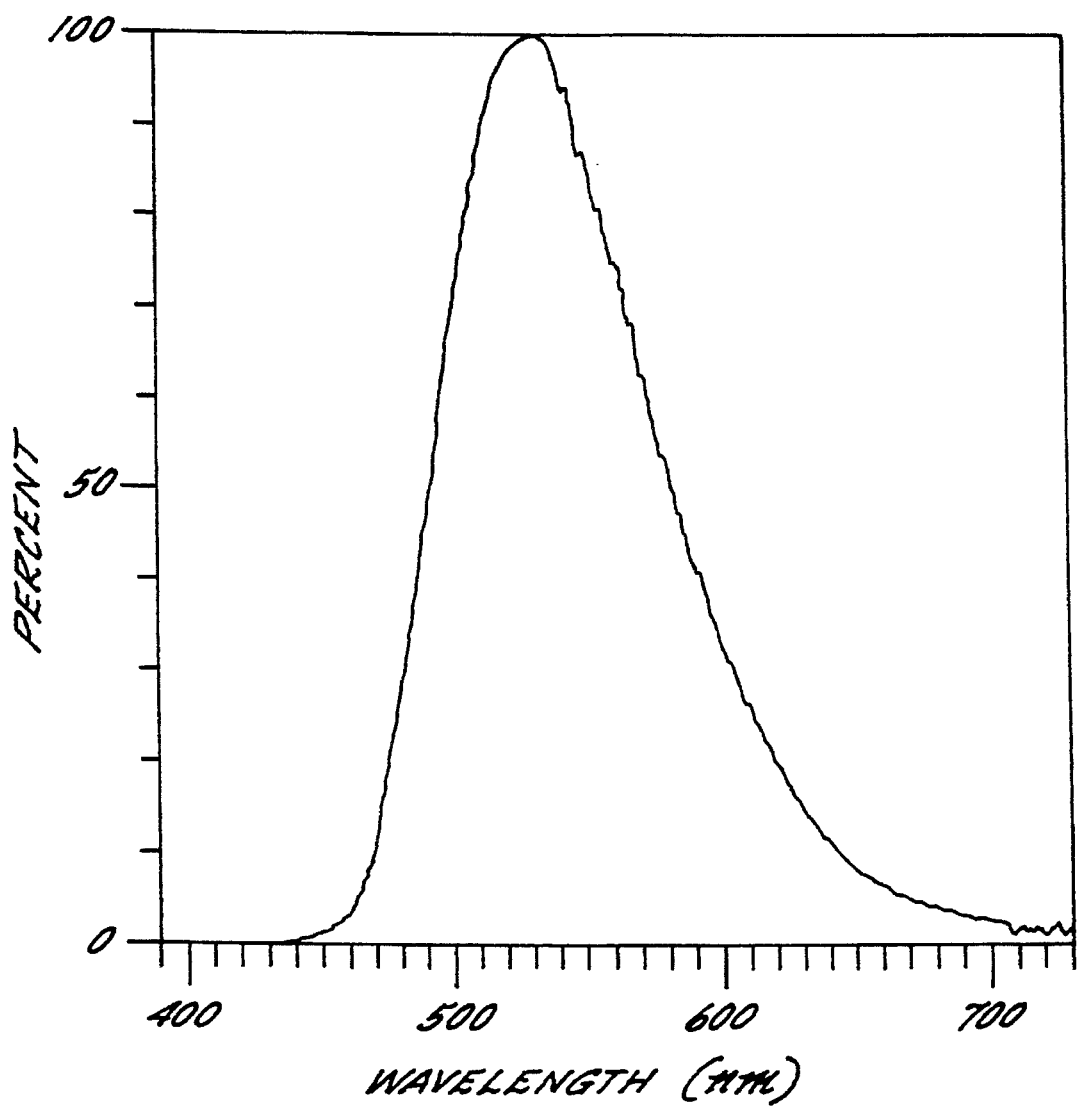
FIG. 3 is a plot of intensity versus wavelength for the emission produced by a diode according to the present invention.

A second ohmic contact 24 is made to the second epitaxial layer 23, and when current is passed across the junction 27, the resulting diode produces an emission with a peak wavelength of about 530 nm and a spectral half width of no more than about 90 nm, as illustrated by the spectrum shown in FIG. 3. It will be understood that the peak emission of 530 nm is observed at room temperature and that higher temperatures will somewhat shift the band width and the resulting emission in a manner well understood to those familiar with semiconductor devices and the quantum mechanical behavior that they exhibit.

The diodes of the present invention, including those set forth in FIGS. 1 and 2, produce at least 50 microwatts of radiation power at a standard current of about 20 milliamps, and in some cases exhibit more than 100 microwatts. As noted with respect to the prior devices described earlier, this is almost an order of magnitude increase in the efficiency and output of the device. In particular, FIG. 3 illustrates the performance of a diode according to the invention with a peak wavelength of 532 nm, a radiant flux of 60 microwatts (μW) and a luminous intensity of 2.2 microcandles (mcd) at a forward current of 20 milliamps and a forward voltage of 3.2 volts (V).

As presently best understood, and without otherwise limiting the scope of the invention, it appears that the second layer comprises a series of recombination centers that produce the 530 nm emission when a forward current is passed across the p-n junction. These recombination centers are considered to most likely comprise point defects or defect complexes. It will be understood that the terms "defect" or "vacancy" as used herein do not refer to negative or undesirable characteristics but rather to a position in the silicon carbide crystal lattice that is different from what it would be in a perfect or undoped silicon carbide crystal. Thus, the appropriate set of "defects" can be highly desirable and indeed such defects produce the green wavelengths of the present invention, but do not imply negative characteristics about the structure or performance of the device.

In preferred embodiments of the invention, the carrier concentrations in the epitaxial layers 22 and 23 are between about 1E15 and 5E17 ($1 \times 10^{15}$ cm$^{-3}$ and $5 \times 10^{17}$ cm$^{-3}$). Furthermore, the low doping concentration in the epitaxial film makes it possible to expand the recombination zone in n-type structures.

FIG. 1 illustrates a more preferred embodiment of the invention with the diode broadly designated at 10. In FIG. 1, the diode includes an n-type 6H silicon carbide substrate which has a planar surface 18 inclined more than 1° off axis towards one of the <11$\bar{2}$0> directions. An ohmic contact 17 is made to the substrate 11. A first epitaxial layer 12 of n-type 6H silicon carbide is on the inclined surface 18 of the n-type substrate 11. A second layer of p-type 6H silicon carbide 13 is adjacent the n-type first layer 12 for forming a p-n junction 19 between the first and second layers. A third layer 15, preferably an additional epitaxial layer, of p-type 6H silicon carbide is upon the second layer 13 and has a p-type carrier concentration somewhat greater than the second layer 13 for encouraging current spreading and increasing the resulting light output. An ohmic contact 16 is made to the third layer 15, with the diode producing a peak wavelength of about 530 nm and with a spectral half width of no more than about 90 nm.

FIG. 1 also illustrates a relatively thin layer 14, it being understood that the layers are shown in various thicknesses for illustrative purposes and are not necessarily to scale, which is formed in accordance with the method aspects of the invention as will be described further herein.

In preferred embodiment, the third layer 15 has a thickness sufficient to enhance the optical properties of the overall diode in a manner set forth in copending application Ser. No. 08/081,668 filed Jun. 23, 1993, "Blue Light Emitting Diode With High External Quantum Efficiency," which is assigned to the assignee of the present invention and which is incorporated entirely herein by reference. In this embodiment the third layer 15 has side walls and a top surface that forms the top surface of the diode 10, and has a thickness sufficient to increase the solid angle at which light emitted by the junction 19 will radiate externally from the side walls. The thickness is less, however, than the thickness at which internal absorption in the third layer 15 would substantially reduce the light emitted from the top surface of the diode.

In another aspect, the invention comprises the method of producing the true green light emitting diode in silicon carbide. The method comprises depositing a first epitaxial layer of 6H silicon carbide on a prepared planar surface of a 6H silicon carbide substrate in which the planar surface is inclined more than 1° off axis with respect to a basal plane thereof substantially towards one of the <11$\bar{2}$0> directions. In this regard, a preferred technique for the first depositing step is set forth in U.S. Pat. No. 4,912,064 to Kong et al. which is incorporated entirely herein by reference. As set forth therein, the slight off axis orientation of the substrate promotes a highly accurate epitaxial layer on the substrate. Indeed, the Kong technique, for which the present assignee is the exclusive licensee, is one of the more fundamental techniques that has propelled recent growth in commercially successful silicon carbide devices.

Figure 4:
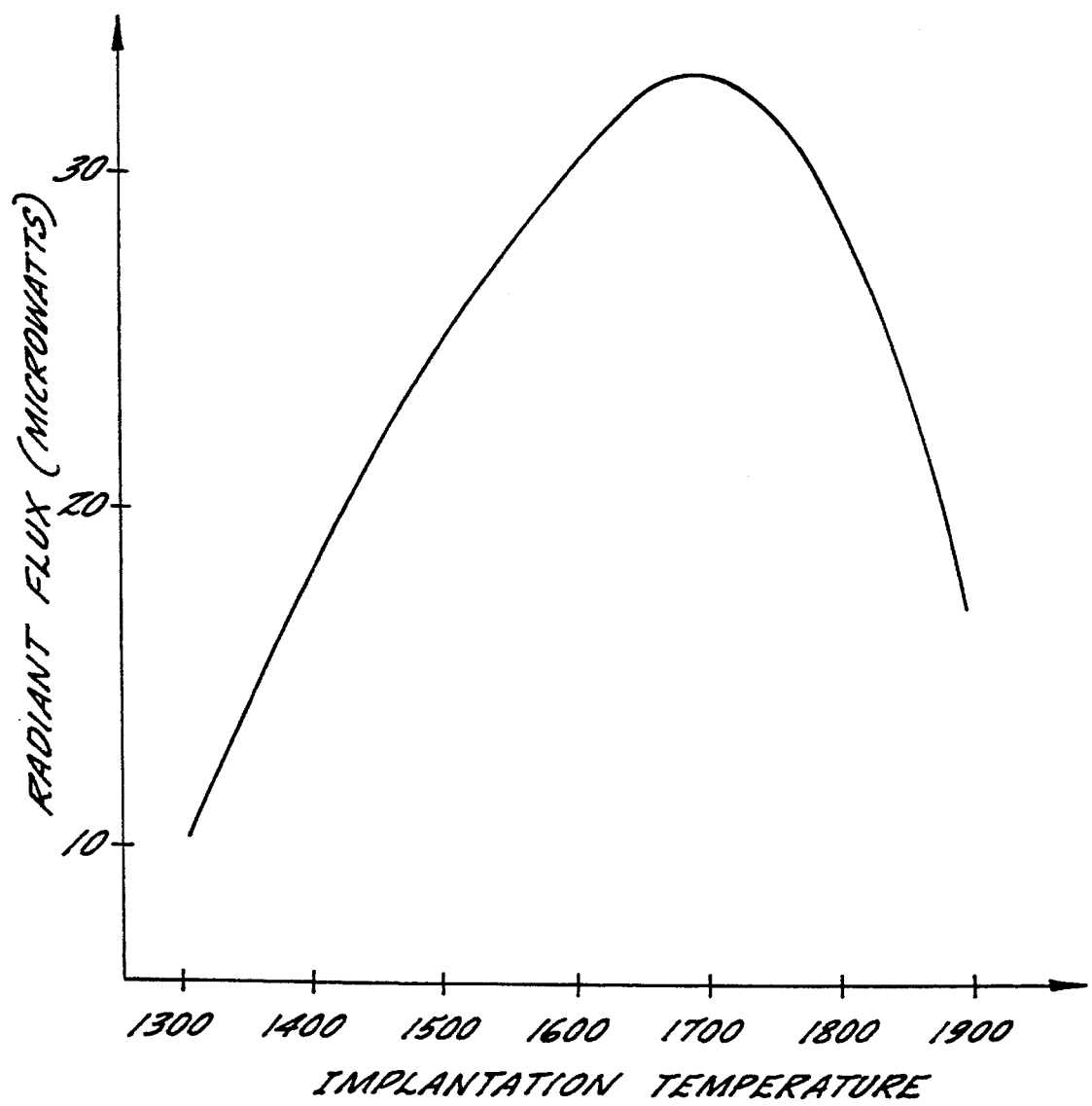
FIG. 4 is a plot of radiant flux in microwatts plotted against the temperature at which diodes produced according to of the method of the present invention were implanted.

After the first epitaxial layer has been deposited, the next step comprises directing an ion implantation beam of dopant ions onto the first epitaxial layer while maintaining the layer at a temperature high enough to position dopant atoms at substitutional lattice sites in the epitaxial layer, but less than the temperature at which excessive graphitization of the silicon carbide would occur. This produces an implanted layer on the first epitaxial layer having the opposite conductivity type from the first layer and thereby produces a p-n junction between the first layer and the implanted layer. Graphite is then removed from the surface of the implanted layer without affecting the electronic characteristics of the implanted layer or of the junction. In preferred embodiments, the step of directing the ion implantation beam while maintaining the layer at a high temperature comprises maintaining the layer at a temperature above about 1500° C. and below about 1900° C., with temperatures of between about 1700° and 1800° C. being most preferred. The relationship between the implantation temperature and the resulting radiant flux in microwatts of an unpackaged diode according to the present invention is set forth in FIG. 4, which also illustrates that the method has some effectiveness even at temperatures below 1500° C.

In preferred embodiments, the step of removing graphite from the surface of the implanted layer comprises either annealing the surface in the presence of a dopant that would produce a conductivity type the same as that of the dopant implanted, or removing graphite by exposing the surface to an oxygen plasma. As an example of the annealing step, when the implanted layer is p-type, the annealing step is carried out in the presence of a p-type dopant such as aluminum.

Alternatively, when the implanted layer is n-type, the annealing should be carried out in the presence of an n-type dopant such as nitrogen. It will be understood that when the top layer is p-type, if the annealing took place without a p-type dopant, an undesirable n-p-n structure could result. Although not wishing to be bound by a particular theory, it appears that the step of annealing the surface further comprises depositing a thin epitaxial layer (14 in FIG. 1) of 6H silicon carbide on the implanted layer, and that has the same conductivity type as the implanted layer.

Further to the theory of the invention, but without otherwise limiting its scope, it appears that the lower limit for the implantation temperature is best defined as the temperature at which silicon begins to leave the silicon carbide lattice structure (about 1400° C. in a vacuum) so that the dopant (e.g., aluminum for p-type) atoms can occupy the former silicon sites. The upper limit (about 1900° C.) appears to be the temperature at which excessive decomposition of the silicon carbide begins to occur leaving behind an undesired graphite surface.

It appears that implantation of aluminum ions at high temperature results in the activation of the implanted ions accompanied by formation of a p-type layer and in a high concentration of defect centers which produce radiation recombination in the n-type structures. The implantation can be carried out either on the silicon (0001) face or the carbon (000$\bar{1}$) face of the 6H silicon carbide epitaxial layer, but the silicon face is slightly preferred as it has a higher thermal stability than the carbon face and thus permits implantation at higher temperatures, particularly when the sample is implanted in a vacuum.

In the ion implantation step, the ion beam is preferably directed at an energy of between about 20 and 200 kilo electron volts (keV) at a dosage of between about 5E15 and 5E17 ions per square centimeter. A time period of about 20 minutes appears to be of maximum benefit for the implantation with longer periods tending to encourage sublimation of the epitaxial layer or other related damage because of the high implantation temperatures. The region of luminescence appears to grow thicker within this preferred temperature range as well.

As set forth with respect to the structural aspects of the invention, in a preferred embodiment the method further comprises the step of depositing the additional epitaxial layer (15 in FIG. 1) of 6H silicon carbide on the implanted layer 13 to encourage current spreading and the resulting light output of the diode.

In the drawings and specification, there have been disclosed typical preferred embodiments of the invention and, although specific terms have been employed, they have been used in a generic and descriptive sense only and not for purposes of limitation, the scope of the invention being set forth in the following claims.

That which is claimed is:

1. A method of producing a true green light emitting diode in silicon carbide, the method comprising:

depositing a first epitaxial layer of 6H silicon carbide having a first conductivity type on a prepared planar surface of a 6H silicon carbide substrate in which the planar surface is inclined more than one degree off axis with respect to a basal plane thereof substantially towards one of the <11$\bar{2}$0> directions;

directing an ion implantation beam of dopant ions onto the first epitaxial layer while maintaining the layer at a temperature high enough to position dopant atoms at substitutional lattice sites in the epitaxial layer but less than the temperature at which excessive graphitization of the silicon carbide would occur to produce an implanted layer on said first epitaxial layer having the opposite conductivity type from said first layer, and to thereby produce a p-n junction between said first layer and said implanted layer; and removing graphite from the surface of the implanted layer without affecting the electronic characteristics of the implanted layer or the junction.

2. A method of producing a light emitting diode according to claim 1 wherein the step of directing an ion implantation beam while maintaining the layer at a high temperature comprises maintaining the layer at a temperature above about 1500° C. and below about 1900° C.

3. A method of producing a light emitting diode according to claim 1 wherein the step of directing an ion implantation beam while maintaining the layer at a high temperature comprises maintaining the layer at a temperature of between about 1700° and 1800° C.

4. A method of producing a light emitting diode according to claim 1 wherein the step of removing graphite from the surface of the implanted layer comprises annealing the surface in the presence of a dopant that would produce a conductivity type the same as that of the dopant implanted.

5. A method of producing a light emitting diode according to claim 4 wherein the step of annealing the surface further comprises depositing a thin epitaxial layer of 6H silicon carbide on the implanted layer having the same conductivity type as the implanted layer.

6. A method of producing a light emitting diode according to claim 4 wherein:

the step of depositing a first layer comprises depositing an n-type layer;

the step of directing an ion beam comprises directing a beam of acceptor dopant ions to form a p-type implanted layer; and the step of annealing the surface comprises annealing the surface in the presence of aluminum.

7. A method of producing a light emitting diode according to claim 4 wherein:

the step of depositing a first layer comprises depositing a p-type layer;

the step of directing an ion beam comprises directing a beam of donor dopant ions to form an n-type implanted layer; and the step of annealing the surface comprises annealing the surface in the presence of nitrogen.

8. A method of producing a light emitting diode according to claim 1 wherein the step of removing graphite from the surface of the implanted layer comprises exposing the surface to an oxygen plasma.

9. A method according to claim 1 further comprising the step of depositing an additional epitaxial layer of 6H silicon carbide upon the implanted layer to encourage current spreading and the resulting light output of the diode.

10. A method of producing a light emitting diode according to claim 1 wherein the step of ion implantation comprises directing the ion beam at an energy of between about 20 and 200 keV at a dosage of between about $5 \times 10^{15}$ and $5 \times 10^{17}$ ions per square centimeter.

11. A method of producing a true green light emitting diode in silicon carbide, the method comprising:

depositing a first epitaxial layer of 6H silicon carbide on a prepared planar surface of a 6H silicon carbide substrate in which the planar surface is inclined more than one degree off axis with respect to a basal plane thereof substantially towards one of the <11$\bar{2}$0> directions;

directing an ion implantation beam of dopant ions onto the first epitaxial layer while maintaining the layer at a temperature high enough to position dopant atoms at substitutional lattice sites in the epitaxial layer but less than the temperature at which excessive graphitization of the silicon carbide would occur to produce an implanted layer on said first epitaxial layer having the opposite conductivity type from said first layer, and to thereby produce a p-n junction between said first layer and said implanted layer;

annealing the surface in the presence of a dopant that would produce a conductivity type the same as that of the dopant implanted; and depositing an additional epitaxial layer of 6H silicon carbide upon the implanted layer to encourage current spreading and the resulting light output of the diode.

12. A method according to claim 11 wherein the step of depositing the additional epitaxial layer on the implanted layer comprises depositing an epitaxial layer with the same conductivity type as the implanted layer.

13. A method according to claim 11 wherein:

the step of depositing a first layer comprises depositing an n-type layer;

the step of directing an ion beam comprises directing a beam of acceptor dopant ions to form a p-type implanted layer;

the step of annealing the surface comprises annealing the surface in the presence of aluminum; and the step of depositing an additional epitaxial layer comprises depositing a p-type layer.

14. A method of producing a light emitting diode according to claim 11 wherein:

the step of depositing a first layer comprises depositing a p-type layer;

the step of directing an ion beam comprises directing a beam of donor dopant ions to form an n-type implanted layer;

the step of annealing the surface comprises annealing the surface in the presence of nitrogen; and the step of depositing an additional epitaxial layer comprises depositing an n-type layer.

15. A method according to claim 11 wherein the step of directing the ion implantation beam comprises directing the beam against the (0001) silicon face of said first epitaxial layer.

16. A method according to claim 11 wherein the step of directing the ion implantation beam comprises directing the beam against the (000$\bar{1}$) carbon face of said first epitaxial layer.

17. A method of producing a light emitting diode according to claim 11 wherein the step of ion implantation comprises directing the ion beam at an energy of between about 20 and 200 keV at a dosage of between about $5 \times 10^{15}$ and $5 \times 10^{17}$ ions per square centimeter.

* * * * *